(12) United States Patent
Maier et al.

(10) Patent No.: US 12,671,058 B2
(45) Date of Patent: Jun. 30, 2026

(54) METHOD FOR IMPEDANCE MATCHING, IMPEDANCE MATCHING ARRANGEMENT AND PLASMA SYSTEM

(71) Applicant: TRUMPF Huettinger GmbH + Co. KG, Freiburg (DE)

(72) Inventors: Florian Maier, Pfaffenweiler (DE); Christian Bock, Freiburg (DE); Marcin Morkowski, Zielonka (PL)

(73) Assignee: TRUMPF HUETTINGER GMBH + CO. KG, Freiburg (DE)

( * ) Notice: Subject to any disclaimer, the term of this patent is extended or adjusted under 35 U.S.C. 154(b) by 268 days.

(21) Appl. No.: 18/458,177

(22) Filed: Aug. 30, 2023

(65) Prior Publication Data

US 2024/0006156 A1     Jan. 4, 2024

Related U.S. Application Data

(63) Continuation of application No. PCT/EP2022/055151, filed on Mar. 1, 2022.

(30) Foreign Application Priority Data

Mar. 1, 2021     (DE) ..................... 10 2021 201 937.4

(51) Int. Cl.
$H01J\ 37/32$          (2006.01)

(52) U.S. Cl.
CPC .. H01J 37/32183 (2013.01); H01J 37/32926 (2013.01)

(58) Field of Classification Search
None
See application file for complete search history.

(56) References Cited

U.S. PATENT DOCUMENTS

| | | | | |
|---|---|---|---|---|
| 9,865,432 B1 * | 1/2018 | Bhutta | .............. | H01J 37/32183 |
| 10,483,090 B2 * | 11/2019 | Bhutta | .............. | H01J 37/32183 |

(Continued)

FOREIGN PATENT DOCUMENTS

| | | |
|---|---|---|
| CN | 101489345 A | 7/2009 |
| DE | 102009001355 A1 | 9/2010 |

(Continued)

OTHER PUBLICATIONS

Giorgio Bacelli et al., "Impedance Matching Controller for an Inductively Coupled Plasma Chamber," L-type Matching Network Automatic Controller, Proceedings of the Fourth International Conference on Informatics in Control Automation and Robotics, 2007, pp. 202-207, SciTePress, Setubal, Portugal.

*Primary Examiner* — Srinivas Sathiraju
(74) *Attorney, Agent, or Firm* — LEYDIG, VOIT & MAYER, LTD.

(57)          ABSTRACT

A method for impedance matching using an impedance matching network is provided. The impedance matching network includes an input, an output, and at least two matching stages connected in series, each matching stage having a respective variable reactance. The method includes a) measuring an input impedance at the input, b) determining an intermediate impedance occurring between the two matching stages from the input impedance and at least one present state value of at least one of two matching stages, c) determining an alteration target value for at least one of the variable reactances of the two matching stages from the intermediate impedance and a model of the impedance matching network, d) altering a state of at least one of the two matching stages based on the alteration target value, and e) repeating steps a) to d).

17 Claims, 3 Drawing Sheets

(56)     References Cited

U.S. PATENT DOCUMENTS

| | | | | |
|---|---|---|---|---|
| 10,727,029 | B2 * | 7/2020 | Ulrich | H01J 37/32183 |
| 10,734,196 | B2 * | 8/2020 | Morii | H01J 37/32091 |
| 10,778,209 | B1 * | 9/2020 | Morii | H03K 17/04123 |
| 10,812,071 | B2 * | 10/2020 | Morii | H03H 7/0115 |
| 10,971,335 | B2 * | 4/2021 | Kim | H01J 37/32935 |
| 10,985,735 | B2 * | 4/2021 | Morii | H01J 37/32183 |
| 11,222,767 | B2 * | 1/2022 | Ziemba | H01J 37/3467 |
| 11,387,078 | B2 * | 7/2022 | Morii | H01J 37/241 |
| 11,552,612 | B2 * | 1/2023 | Morii | H03H 11/30 |
| 11,651,938 | B2 * | 5/2023 | Takahara | H03H 7/38 |
| | | | | 156/345.28 |
| 11,791,134 | B2 * | 10/2023 | Morii | H01J 37/32183 |
| | | | | 307/109 |
| 2008/0158927 | A1 * | 7/2008 | Omae | H01J 37/32174 |
| | | | | 363/165 |
| 2010/0225411 | A1 * | 9/2010 | Maier | H01J 37/32183 |
| | | | | 333/32 |
| 2011/0037516 | A1 * | 2/2011 | Nejati | H03F 3/72 |
| | | | | 330/124 R |
| 2014/0145636 | A1 * | 5/2014 | Merte | H05H 1/46 |
| | | | | 315/224 |
| 2015/0179406 | A1 * | 6/2015 | Johnson | H03H 7/40 |
| | | | | 716/137 |
| 2015/0236728 | A1 * | 8/2015 | Suzuki | H04B 1/0458 |
| | | | | 455/127.1 |
| 2016/0204757 | A1 * | 7/2016 | Kim | H03H 7/40 |
| | | | | 333/32 |
| 2017/0069465 | A1 * | 3/2017 | Bock | H01J 37/32183 |
| 2018/0247795 | A1 | 8/2018 | Maier et al. | |
| 2019/0013185 | A1 * | 1/2019 | Bhutta | H01J 37/32183 |
| 2019/0355554 | A1 * | 11/2019 | Ulrich | H01J 37/32183 |
| 2020/0035461 | A1 * | 1/2020 | Bhutta | H01J 37/32183 |
| 2020/0075291 | A1 * | 3/2020 | Miki | H03H 7/38 |
| 2020/0083022 | A1 * | 3/2020 | Huang | H01J 37/32183 |
| 2020/0203130 | A1 * | 6/2020 | Bhutta | H01J 37/32183 |
| 2020/0343076 | A1 * | 10/2020 | Bhutta | H01J 37/32183 |
| 2020/0357610 | A1 * | 11/2020 | Bhutta | H01J 37/32183 |
| 2020/0402767 | A1 * | 12/2020 | Bhutta | H01J 37/32183 |
| 2021/0013009 | A1 * | 1/2021 | Oliveti | H01J 37/32183 |
| 2021/0090859 | A1 * | 3/2021 | Bhutta | H01J 37/32183 |
| 2021/0327684 | A1 * | 10/2021 | Bhutta | H01J 37/32183 |
| 2022/0037123 | A1 * | 2/2022 | Zhang | H01J 37/32183 |
| 2022/0254610 | A1 * | 8/2022 | Bhutta | H01J 37/32183 |
| 2023/0082359 | A1 * | 3/2023 | Bhutta | H01J 37/32183 |
| | | | | 333/17.3 |
| 2023/0215696 | A1 * | 7/2023 | Decker | H01J 37/32183 |
| | | | | 333/17.3 |
| 2023/0216467 | A1 | 7/2023 | Nordmann | |
| 2023/0231543 | A1 * | 7/2023 | Van Zyl | H03H 7/40 |
| | | | | 327/551 |
| 2024/0006156 | A1 * | 1/2024 | Maier | H01J 37/32174 |

FOREIGN PATENT DOCUMENTS

| | | |
|---|---|---|
| DE | 102011007597 A1 | 10/2012 |
| DE | 102011007598 A1 | 10/2012 |
| DE | 102011076404 A1 | 11/2012 |
| DE | 102014209469 A1 | 11/2015 |
| DE | 102015220847 A1 | 4/2017 |
| DE | 202020103539 U1 | 6/2020 |
| DE | 202021100710 U1 | 2/2021 |
| JP | 2015018766 A | 1/2015 |

* cited by examiner

METHOD FOR IMPEDANCE MATCHING, IMPEDANCE MATCHING ARRANGEMENT AND PLASMA SYSTEM

CROSS REFERENCE TO RELATED APPLICATIONS

This application is a continuation of International Application No. PCT/EP2022/055151 (2022/184713 A1), filed on Mar. 1, 2022, and claims benefit to German Patent Application No. DE 10 2021 201 937.4, filed on Mar. 1, 2021. The aforementioned applications are hereby incorporated by reference herein.

FIELD

Embodiments of the present invention relate to a method for impedance matching using an impedance matching network having an input for connection of an RF power generator and an output for connection to a load, said impedance matching network comprising at least one first and one second matching stage connected in series, each having a variable reactance. Embodiments of the invention also relate to an impedance matching arrangement, a computer program product and a non-volatile storage medium. Embodiments of the invention also relate to a plasma system having such an impedance matching arrangement or having such an impedance matching network.

BACKGROUND

In this case, the load can be a plasma process apparatus, in particular an RF-excited plasma process apparatus, i.e. an apparatus for carrying out plasma processes. An impedance matching network is commonly used in an RF-excited plasma process. An arrangement designed for a method for impedance matching and/or comprising such an impedance matching network and a plasma process apparatus connected thereto is referred to hereinafter as a plasma system. The frequencies here are typically at 1 MHz or more, in particular in the range of 1 MHz to 200 MHz. An RF-excited plasma process is used, for example, for coating (sputtering) and/or etching substrates, in the manufacture of architectural glass, semiconductors, photovoltaic elements, flat panel screens, displays, etc. The impedance of such a process often changes very rapidly, and therefore the impedance matching should often be adapted very rapidly (within a few milliseconds or less). The electrical power usually supplied to such a process is in the region of a few 100 W, for example 300 W and greater, but it is also not uncommon for the power to be a kilowatt or more, and often even 10 kW or more. At such powers, the voltage within the impedance matching arrangements is often several 100 V, for example 300 V or more, and not infrequently even 1000 V or more. The currents in such circuits can be several amperes, often 10 A or more, sometimes even 100 A or more. Implementing an impedance matching network at such voltages and currents has always been a major challenge. The rapid alterability of reactances in such an impedance matching network is an additional, very great challenge. Examples of such impedance matching networks are disclosed in DE 10 2015 220 847 A1, DE 10 2011 076 404 A1, DE 10 2009 001 355 A1, DE 10 2011 007 598 A1, DE 10 2011 007 597 A1, DE 10 2014 209 469 A1, DE 20 2021 100 710 U1 or in DE 20 2020 103 539 U1.

An impedance matching network is generally used to match the impedance of a load to the impedance of a power generator. Usually an impedance matching network is used to transform the impedance of the load to 50 ohms. An impedance matching network can comprise one or more variable reactances, for example capacitors, for example in an L configuration. The capacitance of the capacitors can be altered by way of motor drives. The input impedance of the impedance matching network can be determined by a measuring device. A matching algorithm attempts to find the correct motor positions or switch positions or other control possibilities in order to achieve impedance matching.

If the load is a load whose impedance changes, in particular changes rapidly, the impedance matching by an impedance matching network often proves to be difficult. In order to find the target positions of the drives for the capacitors, it is known to effect closed-loop control in respect of the magnitude and phase of the input impedance. However, both variables are dependent on the capacitance values of the capacitors. This can lead to slow closed-loop control. A change in sign of the impedance can lead to instabilities, as can a change in sign of the relationship dPhase/dC, d|(Z)|/dC, dRe(Z)/dC or dIm(Z)/dC for both capacitors. In this case, C is the capacitance, Z is the impedance, Re( ) is a real part and Im( ) is an imaginary part and |( )| is a magnitude of a complex variable between the parentheses.

SUMMARY

Embodiments of the present invention provide a method for impedance matching using an impedance matching network. The impedance matching network includes an input for connection of an RF power generator and an output for connection to a load. The impedance matching network includes at least a first matching stage and a second matching stage connected in series. Each of the first matching stage and the second matching stage has a respective variable reactance. The method includes a) measuring an input impedance at the input, b) determining an intermediate impedance from the measured input impedance and at least one present state value of at least one of the first matching stage and the second matching stage, the intermediate impedance being an impedance that occurs between the first matching stage and the second matching stage, c) determining an alteration target value for at least one of the variable reactances of the first matching stage and the second matching stage from the intermediate impedance and a model of the impedance matching network, d) altering a state of at least one of the first matching stage and the second matching stage based on the alteration target value, and e) repeating steps a) to d).

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
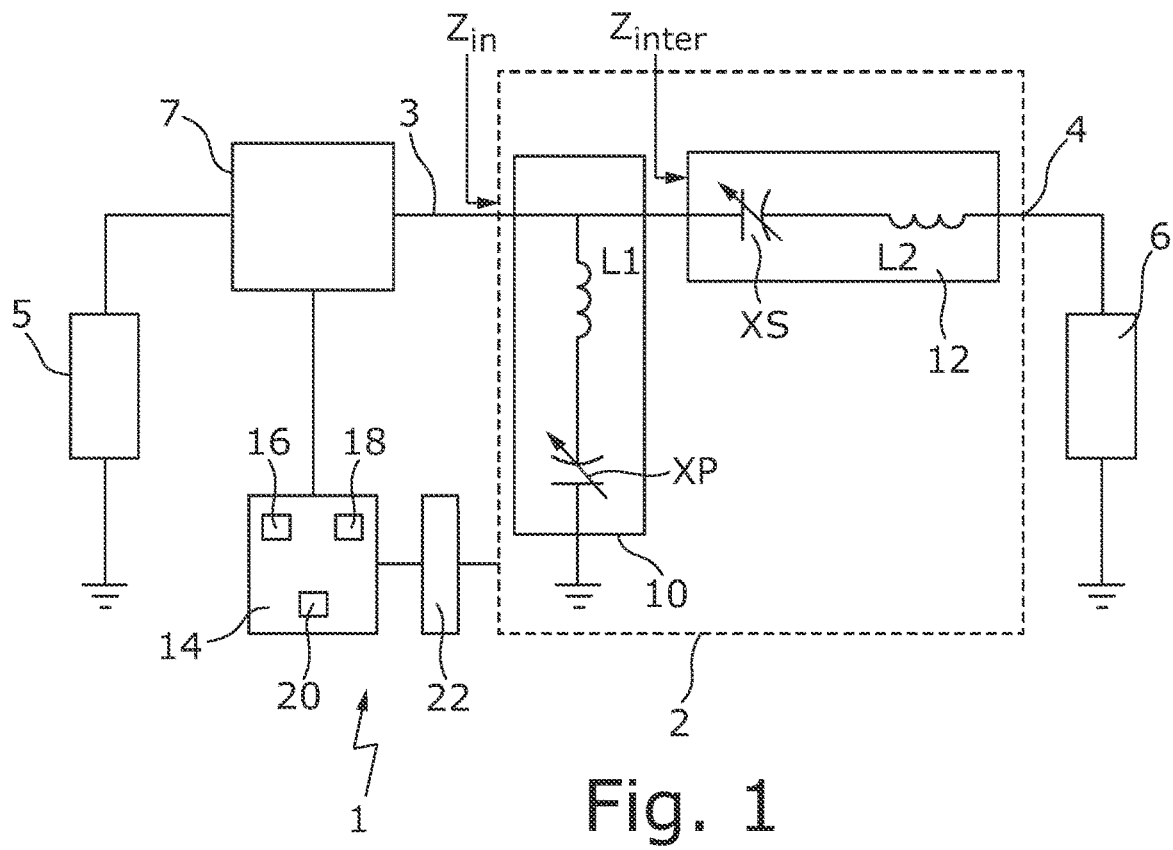
FIG. 1 shows an impedance matching arrangement according to some embodiments.

Embodiments of the present invention provide a method for impedance matching which enables impedance matching to be carried out rapidly and reliably.

According to some embodiments, a method for impedance matching uses an impedance matching network having an input for connection of an RF power generator and an output for connection to a load, in particular to an RF-excited plasma process apparatus, said impedance matching network comprising at least one first and one second matching stage connected in series, each having a variable reactance. The method includes the following steps:

a.) measuring an input impedance $Z_{in}$;

b.) determining an intermediate impedance ($Z_{inter}$) from the measured input impedance ($Z_{in}$) and at least one present state value of at least one of the matching stages, the intermediate impedance being in particular the impedance which occurs between the matching stages;

c.) determining an alteration target value for at least one reactance of a matching stage from the intermediate impedance ($Z_{inter}$) and a model of the impedance matching network;

d.) altering the state of at least one of the matching stages on the basis of the alteration target value;

e.) repeating steps a.) to d.).

A variable reactance can be embodied as an inductance and/or a capacitance. A capacitance is preferred since it is simple to produce and operate. By way of example, a matching stage can comprise a series connection of inductance and capacitance. The matching stage then acts both capacitively and inductively.

Measuring an input impedance $Z_{in}$ can mean that the impedance into the input of the impedance matching network is measured. The impedance can be detected with respect to magnitude and phase and/or real and imaginary parts.

Measuring an input impedance $Z_{in}$ can also mean that the reflection factor is measured and $Z_{in}$ is then derived.

The intermediate impedance is the impedance measured into a matching stage which is disposed upstream of the output of the impedance matching network. The intermediate impedance, too, can be detected or ascertained with respect to magnitude and phase and/or real and imaginary parts.

A model of the impedance matching network should also be understood to be a model for each of the matching stages since the models of the matching stages are each part of the model of the impedance matching network.

This method makes it possible to achieve a more rapid and robust closed-loop control of mechanical and/or electronic impedance matching networks. Known algorithms often do not converge, i.e. do not lead to the desired point or cannot utilize the mechanical dynamic characteristic of the drives used.

Steps a.) to d.) mentioned above can be repeated until the input impedance exceeds or falls below a predefined value. It has been found that the number of iterations needed with the method according to embodiments of the invention is significantly less than the number required with conventional methods. Consequently, much faster impedance matching can be effected.

A position of a mechanically alterable reactance or a circuit state of an electronically alterable reactance can be detected as the state value. By way of example, the position of a drive of a mechanically alterable capacitance can be detected as the state.

The intermediate impedance can be determined on the basis of an assignment of the input impedance to the intermediate impedance depending on the state. This assignment can be determined during a calibration depending on the detected state. In particular, in this way, it is possible to generate a look-up table for each matching stage during a calibration. Preferably, the calibration and the creation of the look-up tables for each matching stage are effected independently of the other matching stage(s).

Advantages are afforded if the alteration target value is determined on the basis of an intermediate impedance target value $Z_{intersoll}$. In order to compensate for variants or inaccuracies of the look-up tables, relative computation is advantageous. If, by way of example, an intermediate impedance target value of j45 ohms is determined for a present detected value of j40 ohms of the imaginary part of $Z_{inter}$, the value which yields j5 ohms more can be sought from the present entry of the look-up table. This is then the target position or the alteration target value and has the advantage that an offset error is thereby compensated for and a scaling error becomes smaller, the nearer the matching is to the desired matching.

In the case of mechanical impedance matching networks, the measurement of the input impedance is orders of magnitude faster than the motor speed of the drives of the capacitors. The determination of an intermediate impedance is not exact owing to various errors (model, measurement, variable plasma impedance). However, it does initially pre-define an approximate target position of the drives. The latter can effect full acceleration as a result. During the alteration of the reactance, the determination of $Z_{in}$ and $Z_{inter}$ is continued continuously and $Z_{intersoll}$ is thereby corrected.

The intermediate impedance target value can be determined on the basis of at least one predefined boundary condition, for example real part of $Z_n$=50 ohms. Such boundary conditions facilitate the determination of the intermediate impedance target value.

The state of at least one of the matching stages can be altered by the alteration target value or in the direction of the alteration target value. As already described, it is advantageous to perform relative matchings. It is therefore not necessary to determine absolute values for the altered state. It is sufficient to determine by how much the state of one matching stage needs to be altered in order that the state of the other matching stage can be altered in such a way that matching takes place. This is done with the aid of the intermediate impedance.

The states of two matching stages can be altered simultaneously. The impedance matching can be accelerated as a result.

A circuit model can be used as the model of the impedance matching network. This has particular advantages if the impedance matching network is of simple construction, for example has an L configuration.

Alternatively, it can be provided that a transmission parameter model, a scattering parameter model, or a parameter model derived from a transmission parameter model or a scattering parameter model, is used as the model of the impedance matching network. By way of example, Z, Y, M, X parameters can be determined from the scattering parameters.

An L, T, inverse L or n configuration can be used as the impedance matching network. Fast impedance matching can be achieved with an L configuration. Such a configuration can also be mapped relatively easily in a model.

An alteration target value can be determined for a respective reactance of two matching stages from the intermediate impedance and a model of each of the matching stages. The states of both matching stages can be altered on the basis of the alteration target value.

The alteration target values can be linearly independent. As a result, it is possible to carry out the matching in the matching stages independently of one another.

Embodiments of the invention additionally provide an impedance matching arrangement having a.) an impedance matching network having an input for connection of an RF power generator and an output for connection to a load, in particular to an RF-excited plasma process apparatus, said impedance matching network comprising at least two matching stages, each having an alterable reactance,
  b.) a model of the impedance matching network,
  c.) an impedance measuring device for measuring the input impedance,
  d.) at least one look-up table containing values which allow an intermediate impedance to be deduced from an input impedance, the intermediate impedance being in particular the impedance which occurs between the matching stages,
  f.) a determining device for determining an intermediate impedance on the basis of a measured input impedance and the look-up table and for determining at least one alteration target value for at least one reactance of a matching stage from the intermediate impedance and a model of the impedance matching network,
  g.) a setting device for altering the state of at least one matching stage on the basis of the determined alteration target value.

The look-up table preferably comprises only one dimension. In the simplest case, it comprises the impedance value of the adjustable reactance. With the aid of a model, in particular a circuit model, the intermediate impedance can be calculated from this impedance by way of a voltage divider computation.

In the case of a T parameter model, for example, at least portions of the T parameters of the matching stage can be stored in the look-up table. It is sufficient to store portions of the T parameters if symmetry considerations can be implemented. Otherwise it is also conceivable to store all the T parameters of the matching stage in the look-up table. With the T parameters (depending on the state of the matching stage) and the input impedance, it is possible to deduce the intermediate impedance.

The model of the impedance matching network and/or the look-up tables can be stored as a digital model in a memory.

Embodiments of the invention also provide a computer program product for controlling an impedance matching network having an input for connection of an RF power generator and an output for connection to a load, said impedance matching network comprising at least one first and one second matching stage connected in series, each having a variable reactance, the computer program product comprising instructions which, when the program is executed by a computer, carry out the following method steps:

a.) determining an intermediate impedance from a measured input impedance and at least one present state value of at least one of the matching stages, the intermediate impedance being in particular the impedance which occurs between the matching stages,
  b.) determining an alteration target value for at least one reactance of a matching stage from the intermediate impedance and a model of the impedance matching network,
  c.) outputting a signal for altering the state of at least one of the matching stages on the basis of the alteration target value,
  d.) repeating steps a.) to c.)

Embodiments of the invention also provide a non-volatile storage medium, having instructions stored thereon for execution by a processor or for configuring a programmable logic component, for example an FPGA, for carrying out steps a.) to d.) of the computer program product.

In data processing, the term non-volatile (non-transitory) storage medium denotes various data storage devices whose stored information is maintained permanently, i.e. even while the computer is not in operation or is not being supplied with power.

Embodiments of the invention provide for creating a model of the impedance matching network. This serves to divide a two-dimensional problem into two one-dimensional (control) problems. With the knowledge about the input impedance (is measured) and the state of a matching stage, the complex load impedance between the two matching stages (intermediate impedance) can be ascertained by applying the model. The mappable impedance trajectories of the matching stages need to intersect at this intermediate impedance in order to achieve matching. A target position (intermediate impedance target value) can be ascertained from this condition.

Embodiments of the invention provide for a manipulated variable of the reactances of the matching stages to be set on the basis of the determined input impedance and the present state of the matching stages in such a way as to establish matching at the input of the impedance matching network. Look-up tables can be ascertained for each matching stage by means of a suitable calibration method, said look-up tables including the individual impedances of the variable reactances over the present state of the matching stage.

Proceeding from the impedance at the input of the respective matching stage, the variation of the individual reactances produces an individual line/trajectory in the impedance, admittance or reflection factor plane. During the matching, proceeding from the input impedance and the manipulated variable of the first variable reactance of the first matching stage in conjunction with the look-up table and the model of the matching stage, which model is part of the model of the impedance matching network, the impedance that arises at the input of the second matching stage is determined. This is the intermediate impedance. The model reveals what trajectory this intermediate impedance would have to lie on in order that the first matching stage can transform this impedance to a target value, for example 50 ohms. In the case of a parallel capacitor as reactance, it holds true, for example, that the reciprocal of all matchable impedances of the intermediate impedance would have a real part of 0.02 S. The variation of the second reactance of the second matching stage then causes the intermediate impedance to be shifted on a defined trajectory. In the case of a series element of an L topology, this trajectory is described by a constant real part of the intermediate imped- ance and a variable imaginary part. Variance of the reactance of the second matching stage thus allows a setting then to be found so that the intermediate impedance will end up on the trajectory of the first reactance. This new intermediate impedance forms the point of intersection of the two trajec- tories. At the same time it is possible to predict what position (state) the first matching stage will have to adopt in order to match the new intermediate impedance.

In the case of an L configuration of an impedance match- ing network, the calibration, in particular generation of look-up tables, can be effected as follows. The first matching stage is a parallel-connected resonant circuit with a variable capacitor; the second matching stage is a resonant circuit in series with the output of the impedance matching network. For the calibration of the look-up tables, firstly the output of the impedance matching network is terminated with an open circuit. Only the impedance of the parallel element is then measured at the input of the impedance matching network. This impedance is altered by variation of the capacitor and the values are stored in the table. For the table of the series element, the output is short-circuited and the parallel ele- ment is set to the smallest value (highest impedance). A parallel connection formed by parallel element and series element is measured at the input of the impedance matching network. Since the impedance of the parallel element is known, the series element can be calculated and the table therefor can be ascertained.

The intermediate impedance can be calculated directly from the input impedance of the first matching stage and the look-up table of the parallel element. An ideal capacitor varies only the imaginary part of the admittance at the input of the impedance matching network. $1/Z_{inter}$ therefore would have a real part of 0.02 S in order to be able to be matched. The series element allows the imaginary part of the inter- mediate impedance to be varied directly. An ellipse arises in the admittance plane. This ellipse intersects the 0.02 S line potentially (depending on the setting range of the capacitors) at two points. Corresponding equating yields a quadratic equation, from which the new series impedance results. The complete new intermediate impedance can then also be calculated from this series impedance. Together with the present value of the parallel impedance, it is possible to ascertain by how much the latter needs to be altered in order to attain an input impedance of 50 ohms.

Embodiments of the invention additionally provide a plasma system designed for a method for impedance match- ing, and/or comprising an impedance matching arrangement as described above and comprising a plasma process appa- ratus as load, in particular an RF-excited plasma process apparatus, i.e. an apparatus for carrying out plasma pro- cesses. The plasma process apparatus is preferably used for coating (sputtering) and/or etching substrates. It is prefer- ably suitable for use in the manufacture of architectural glass, semiconductors, photovoltaic elements, flat panel screens or displays.

The radio frequency of the radio-frequency power signal can be at 1 MHz or more, in particular in the range of 1 MHz to 200 MHz.

The electrical power which is needed to supply the plasma process, and which the power supply device is designed to deliver, can be 300 W or greater, in particular 1 kilowatt or more.

The plasma process apparatus can be designed for con- nection of further power supplies, of which one or more of the following can be used, for example: RF power supply with the same or other radio frequency.

DC power supply, in particular pulsed DC power supply.

MF power supply with frequencies below 1 MHz.

Further features and advantages of the invention are evident from the following detailed description of exem- plary embodiments of the invention, with reference to the figures of the drawing. The features shown there are to be understood as not necessarily to scale. The various features can be realized in each case individually by themselves or as a plurality in any desired combinations.

Exemplary embodiments of the invention are illustrated in the schematic drawing and explained in the description which follows.

FIG. 1 shows an impedance matching arrangement 1 having an impedance matching network 2, which comprises an input 3 and an output 4. An RF power generator 5 can be connected to the input 3 and a load 6, in particular a plasma process apparatus, can be connected to the output 4. The RF power generator 5 can generate a radio-frequency power at a frequency of greater than or equal to 1 MHz, in particular in the range of 1 MHz to 200 MHz.

The input impedance $Z_{in}$ at the input 3 of the impedance matching network 2 can be detected by an impedance measuring device 7. The impedance measuring device 7 can be designed for measuring a complex input impedance $Z_{in}$. The impedance measuring device 7 can be designed for example as a V/I probe, i.e. for measuring voltage and current, in particular for measuring voltage and current including their phase relationship with respect to one another.

The impedance matching network 2 shown comprises an L configuration having a first matching stage 10 and a second matching stage 12 arranged in series therewith. The first matching stage 10 comprises a variable reactance XP, which is embodied as a capacitor in the exemplary embodi- ment shown. The variable reactance XP is arranged in series with an inductance L1.

The second matching stage 12 likewise comprises a variable reactance XS embodied as a capacitor. Said reac- tance is connected in series with an inductance L2.

An intermediate impedance $Z_{inter}$ is the impedance at the input of the second matching stage 12.

The input impedance $Z_{in}$ of the impedance matching network 2 can be measured by the impedance measuring device 7. The measured input impedance $Z_{in}$ can be used by a determining device 14 in order to determine an interme- diate impedance $Z_{inter}$ on the basis of the measured input impedance $Z_{in}$ and at least one looked-up table 16, 18. The look-up tables 16, 18 were created in a calibration method. The look-up tables 16, 18 can comprise the impedance values of the adjustable reactances XP, XS for different states of the reactances XP, XS and thus different states of the matching stages 10, 12.

The determining device 14 is furthermore designed to determine at least one alteration target value for at least one reactance XP, XS of a matching stage 10, 12 from the intermediate impedance $Z_{inter}$ and a model 20 of the imped- ance matching network 2.

A setting device 22 is designed for altering the state of at least one matching stage 10, 12 on the basis of the deter- mined alteration target value.

Figure 2:
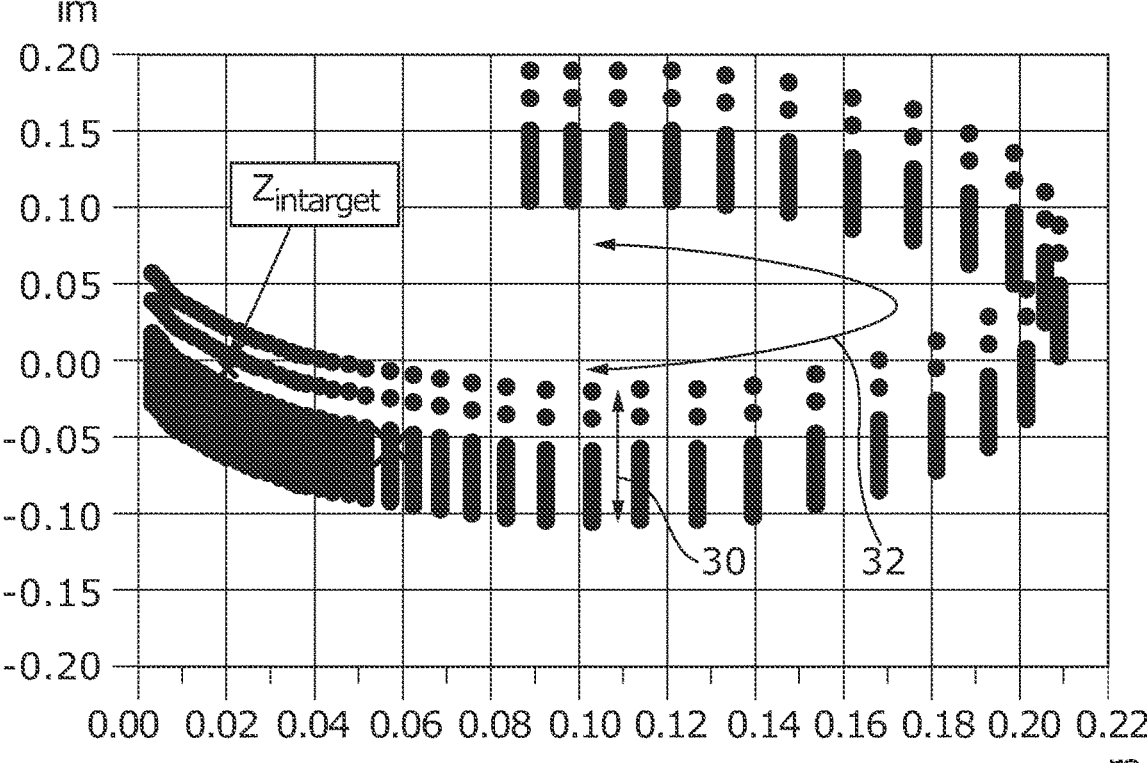
FIG. 2 shows an admittance plane for explaining the method according to embodiments of the invention.

FIG. 2 shows the admittance plane of the input admit- tance, i.e. $1/Z_{in}$. $Z_{in}$ denotes the impedance $Z_{in}$ measured at the input of the impedance matching network 2. $Z_{intarget}$ denotes the admittance that is intended to be attained by means of impedance matching. By virtue of a variation of the reactance XP of the first matching stage 10, only the imaginary part of the input admittance can be altered, which is indicated by the vertical double-headed arrow 30.

By virtue of the reactance XS of the second matching stage 12, the input admittance can be moved on an elliptical trajectory, which is indicated by the arrow 32.

Figure 3:
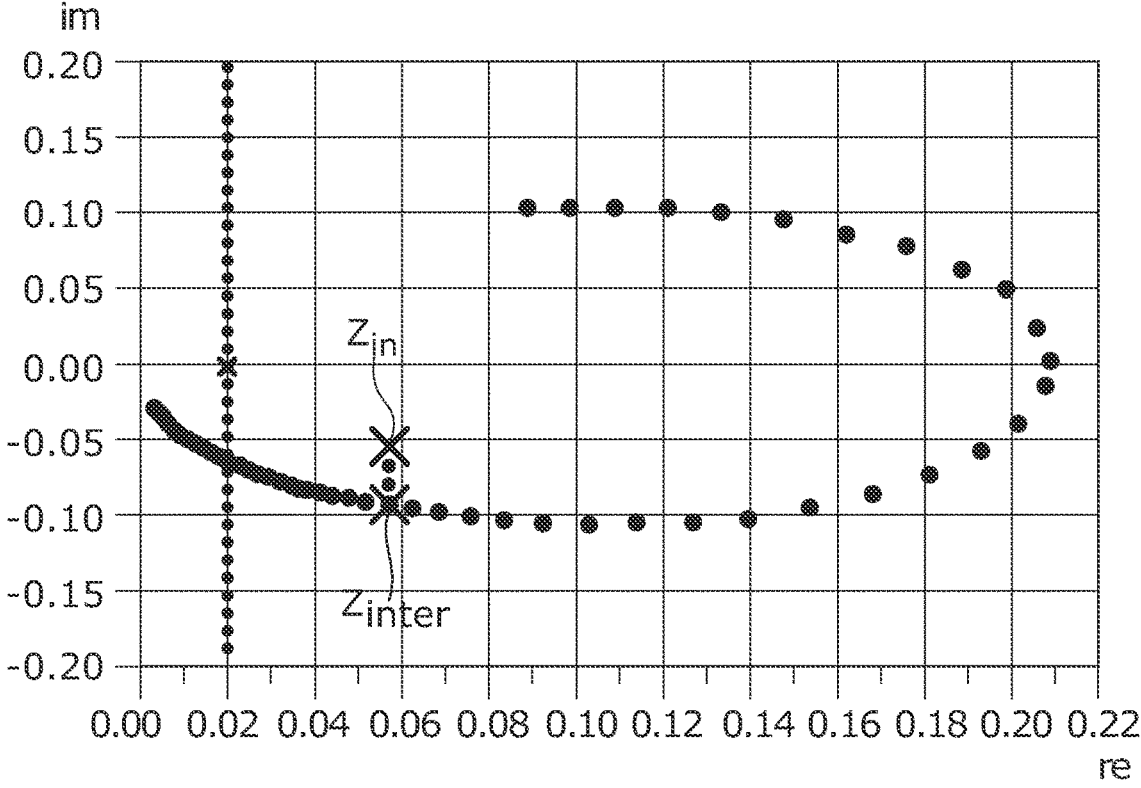
FIG. 3 shows an admittance plane for explaining a first method step of the method according to embodiments of the invention.

It is evident with reference to FIG. 3 that with a known input admittance (reciprocal of $Z_{in}$) and a known value of XP on the basis of the look-up table 16 (with knowledge of the present state of the second matching stage 12, i.e. in particular the motor position of the drive of the reactance XP), it is possible to determine an intermediate impedance $Z_{inter}$. This yields the ellipse on which an admittance alteration takes place as a result of alteration of the reactance XS.

It is then possible to determine by how much the reactance XS needs to be altered so that the ellipse or trajectory T intersects the target line ZL, i.e. the real part of $Z_{inter}$ assumes a value of 0.02 S. This yields an alteration target value dXS.

Figure 4:
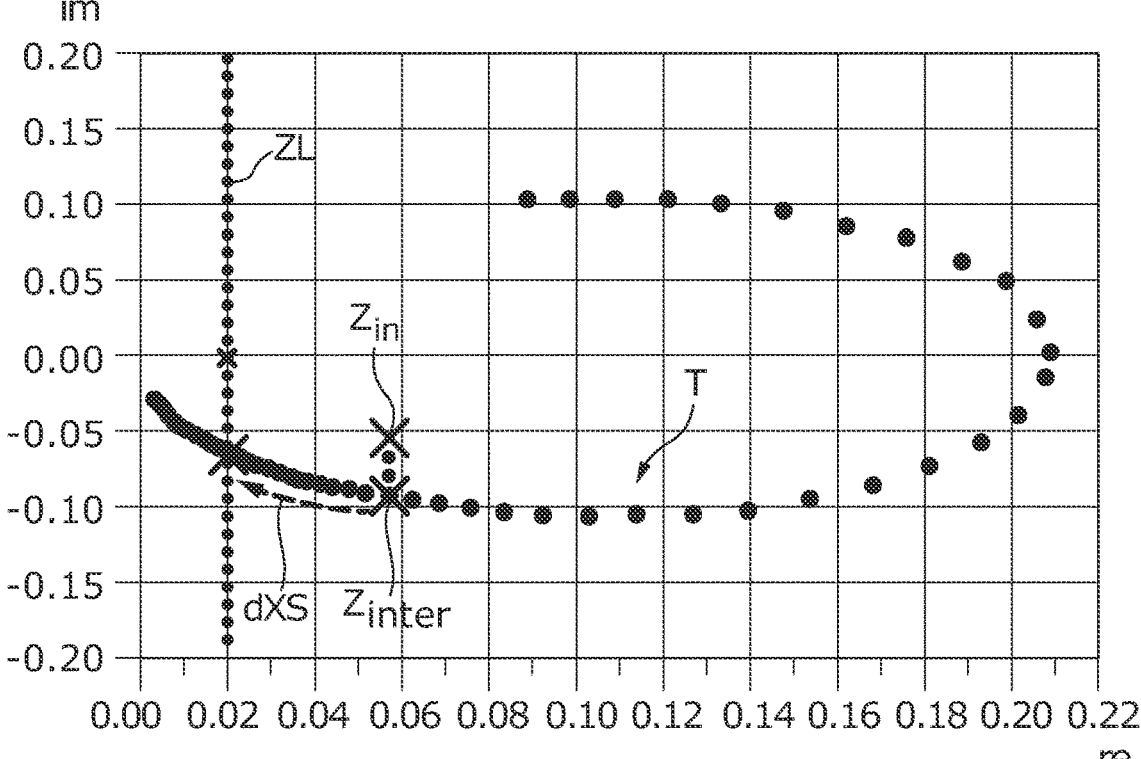
FIG. 4 shows an admittance plane for explaining a second method step of the method according to embodiments of the invention.
Figure 5:
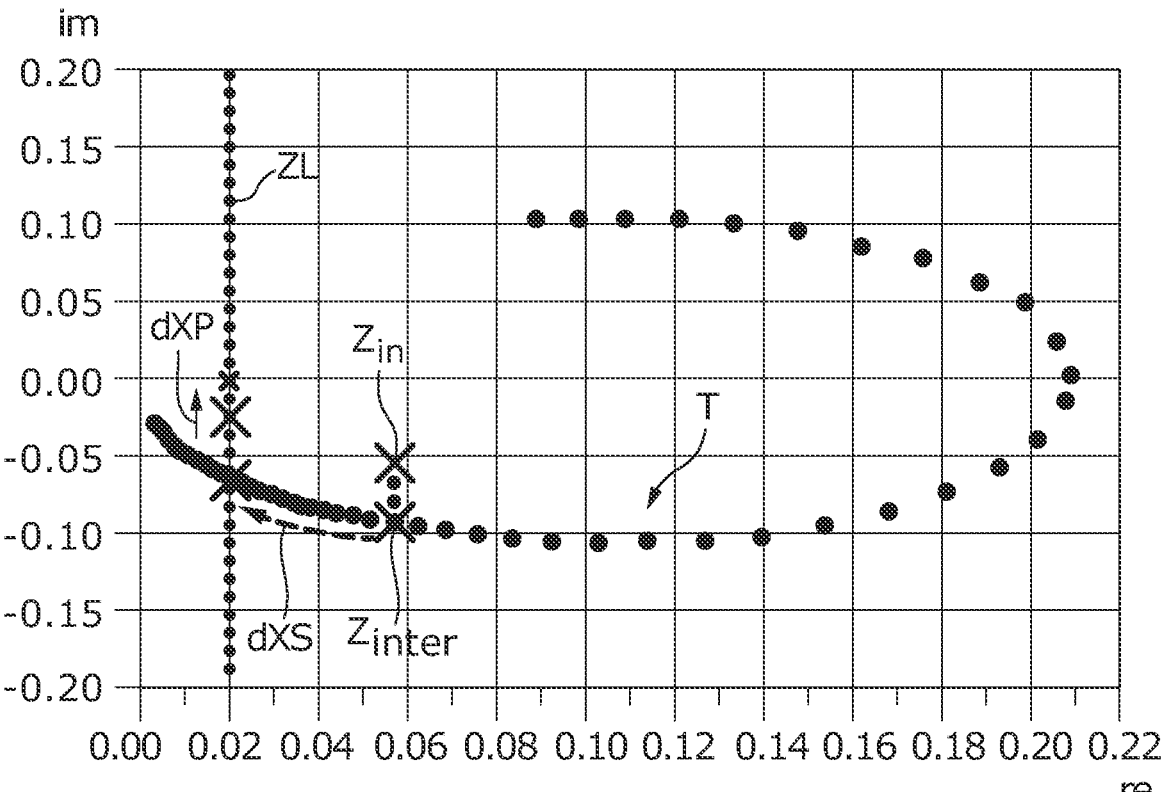
FIG. 5 shows an admittance plane for explaining a third method step of the method according to embodiments of the invention.

In a further step, explained with reference to FIG. 4, it is then possible to determine by how much XP needs to be altered in order to arrive at $Z_{intarget}$. This yields a further alteration target value dXP.

Figure 6:
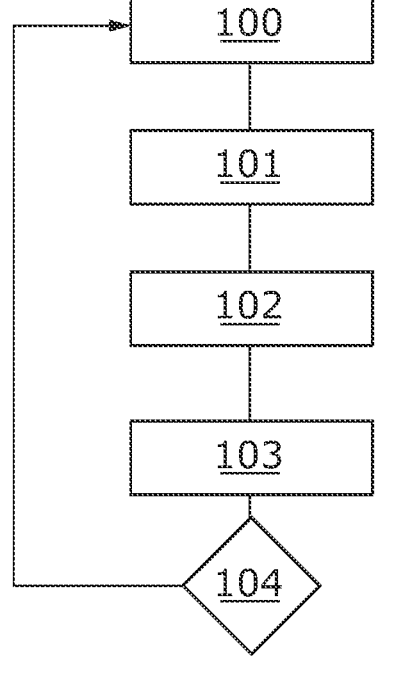
FIG. 6 shows a block diagram for explaining the method according to embodiments of the invention.

The method according to embodiments of the invention is furthermore explained with reference to the block diagram in FIG. 6. In a step 100, the input impedance $Z_{in}$ of the impedance matching network is measured. Afterwards, in step 101, an intermediate impedance is determined from the measured input impedance $Z_{in}$ and at least one present state value of at least one of the matching stages of the impedance matching network.

In step 102, an alteration target value is determined for at least one reactance of a matching stage from the intermediate impedance and a model of the impedance matching network.

In step 103, the state of at least one of the matching stages is altered, on the basis of the alteration target value. Step 104 involves checking whether the input impedance then determined exceeds or falls below a predefined value. If said impedance does not exceed or fall below the predefined value, the method returns to step 100. Otherwise matching is attained.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for impedance matching using an impedance matching network having an input for connection of an RF power generator and an output for connection to a load, the impedance matching network comprising at least a first matching stage and a second matching stage connected in series, each of the first matching stage and the second matching stage having a respective variable reactance, the method comprising:

a) measuring an input impedance at the input, b) determining an intermediate impedance that occurs between the first matching stage and the second matching stage by:

determining an input admittance based on the measured input impedance, determining a position of a mechanically alterable reactance or a circuit state of an electronically alterable reactance as a present state value of at least one of the first matching stage and the second matching stage, c) determining an alteration target value for at least one of the variable reactances of the first matching stage and the second matching stage from the intermediate impedance and a model of the impedance matching network, the alteration target value being determined based on an intermediate impedance target value, d) altering a state of at least one of the first matching stage and the second matching stage based on the alteration target value, and e) repeating steps a) to d).

2. The method according to claim 1, wherein steps a) to d) are repeated until the input impedance exceeds or falls below a predefined value.

3. The method according to claim 1, wherein the intermediate impedance is determined based on an assignment of the input impedance to the intermediate impedance depending on the state.

4. The method according to claim 1, wherein the intermediate impedance target value is determined based on at least one predefined boundary condition.

5. The method according to claim 1, wherein the state of at least one of the first matching stage and the second matching stage is altered by the alteration target value or in a direction of the alteration target value.

6. The method according to claim 1, wherein the state of the first matching stage and the state of the second matching stage are altered simultaneously.

7. The method according to claim 1, wherein the model of the impedance matching network comprises a circuit model.

8. The method according to claim 1, wherein the model of the impedance matching network comprises a transmission parameter model, a scattering parameter model, or a parameter model derivable from the transmission parameter model or the scattering parameter model.

9. The method according to claim 1, wherein the impedance matching network has an L, T, inverse L or π configuration.

10. The method according to claim 1, wherein the alteration target value is determined for the respective reactance of each of the first matching stage and the second matching stage from the intermediate impedance and a model of each of the first matching stage and the second matching stage, and wherein both of the state of the first matching stage and the state of the second matching stage are altered based on the alteration target values.

11. The method according to claim 10, wherein the alteration target values are linearly independent.

12. An impedance matching arrangement comprising:
  a. an impedance matching network having an input for connection of an RF power generator and an output for connection to a load, the impedance matching network comprising at least two matching stages, each matching stage having a respective alterable reactance,
  b. a model of the impedance matching network,
  c. an impedance measuring device for measuring an input impedance,
  d. at least one look-up table containing values that allow an intermediate impedance to be deduced from the input impedance, the intermediate impedance being an impedance that occurs between the two matching stages,
  e. a determining device for determining the intermediate impedance by:
    determining an input admittance based on the measured input impedance,
    determining a position of a mechanically alterable reactance or a circuit state of an electronically alterable reactance as a present state value of at least one of the two matching stages,
    determining an alteration target value for the respective reactance of at least one of the two matching stages from the intermediate impedance and the model of the impedance matching network, the alteration target value being determined based on an intermediate impedance target value, and
  f. a setting device for altering a state of at least one of the two matching stages based on the determined alteration target value.

13. A plasma system comprising an impedance matching arrangement according to claim 12, and an RF-excited plasma process apparatus as the load connected to the output of the impedance matching network.

14. The method according to claim 1, wherein determining the position of the mechanically alterable reactance includes determining a motor position of at least one of a motor drive of the first matching stage and a motor drive of the second matching stage.

15. The method according to claim 14, wherein determining the intermediate impedance includes determining a reactance corresponding to the determined motor position and determining the intermediate impedance based on the determined input admittance and the determined reactance corresponding to the determined motor position.

16. The method according to claim 15, wherein determining the intermediate impedance based on the determined input admittance and the determined reactance corresponding to the determined motor position includes altering the input admittance such that the input admittance lies on an ellipse representing variation of an imaginary part of the intermediate impedance in the admittance plane.

17. A non-transitory computer-readable medium having instructions stored thereon, the instructions, when executed by a computer processor, causing performance of a method for controlling an impedance matching network, the impedance matching network having an input for connection of an RF power generator and an output for connection to a load, the impedance matching network comprising at least a first matching stage and a second matching stage connected in series, each of the first matching stage and the second matching stage having a respective variable reactance, the method comprising:
  a) determining an intermediate impedance that occurs between the first matching stage and the second matching stage by:
    determining an input admittance based on the from a measured input impedance,
    determining a position of a mechanically alterable reactance or a circuit state of an electronically alterable reactance as a present state value of at least one of the first matching stage and the second matching stage,
  b) determining an alteration target value for the respective reactance of at least one of the first matching stage and the second matching stage from the intermediate impedance and a model of the impedance matching network, the alteration target value being determined based on an intermediate impedance target value,
  c) outputting a signal for altering a state of at least one of the first matching stage and the second matching stage based on the alteration target value, and
  d) repeating steps a) to c).

* * * * *